United States Patent [19]

Brunner

[11] Patent Number: 4,704,669

[45] Date of Patent: Nov. 3, 1987

[54] MINIATURE LAMP HOLDER

[75] Inventor: Jean Brunner, La Chaux-de-Fonds, Switzerland

[73] Assignee: Universo S.A., Switzerland

[21] Appl. No.: 906,806

[22] Filed: Sep. 12, 1986

[30] Foreign Application Priority Data

Sep. 13, 1985 [CH] Switzerland .................... 3969/85

[51] Int. Cl.⁴ ............................................. F21V 17/00
[52] U.S. Cl. .................................... 362/455; 362/226; 362/800
[58] Field of Search ............... 362/368, 370, 382, 396, 362/455, 800, 226

[56] References Cited

U.S. PATENT DOCUMENTS 4,195,330  3/1980  Savage, Jr. ..................... 362/800 X
4,471,414  9/1984  Savage, Jr. ..................... 362/800 X

FOREIGN PATENT DOCUMENTS 2714922 10/1978 Fed. Rep. of Germany ...... 362/396

Primary Examiner—Stephen F. Husar
Attorney, Agent, or Firm—Silverman, Cass, Singer and Winburn, Ltd.

[57] ABSTRACT

A ring surrounding the clip which secures the body of an LED diode lamp to a bracket is provided with inner longitudinal grooves which reduce the thickness of the wall of the ring and confer thereto an elasticity which is sufficient for permitting its engagement on clips of different diameters. The manufacture of diode lamps does not provide the bodies of these lamps with very precise or consistent diameters, so that relatively important variations of these diameters can occur, which have an influence on the diameter of the clip when engaged on the lamp. Owing to the present arrangement, diode lamp holders can absorb such variations of diameter of the lamps, and still be secured to a panel or other structure by the ring of the invention.

4 Claims, 3 Drawing Figures

MINIATURE LAMP HOLDER

BACKGROUND OF THE INVENTION

(a) Field of the Invention

The present invention relates to a miniature lamp holder comprising an annular clip surrounding the lamp and a ring engaging the said clip for, on the one hand, maintaining the clip pressed on the lamp and, on the other hand, securing the lamp holder on the bracket intended to receive it.

(b) Description of the Prior Art

Such lamp holders are known per se. They are used, most generally, with diode lamps (LED) and permit to secure them to panels, boards or others.

The mode of manufacturing diode lamps is such that it is practically impossible for the manufacturer to respect very precisely the prescribed dimensions so far as the diameter of the body of the lamps is concerned. Thus, for instance, for a diode having a nominal diameter of 3 mm, the variations can go from 2.8 to 3.4, that is to say can extend on a range of 6 tenths of 1 mm.

Consequently, it is necesary either to have lamp holders of corresponding dimensions or to put to waste the diode lamps the diameters of which are too far from the prescribed value.

SUMMARY OF THE INVENTION

The object of the present invention is to remove this drawback.

This object is acieved due to the fact that in the lamp holder according to the invention the ring which surrounds the clip is provided with at least a longitudinal inner recess producing a thinning of its wall owing to which this ring is able to be deformed resiliently and thus to absorb the irregularities of the diameter of the lamp due to the tolerances of manufacturing of the lamp.

The various features of the invention will be apparent from the following description, drawings and claims, the scope of the invention not being limited to the drawings themselves as the drawings are only for the purpose of illustrating a way in which the principles of the invention can be applied. Other embodiments of the invention utilising the same or equivalent principles may be used and structural changes may be made as desired by those skilled in the art without departing from the present invention and the purview of the appended claims.

DESCRIPTION OF THE PREFERRED EMBODIMENTS

Figure 1:
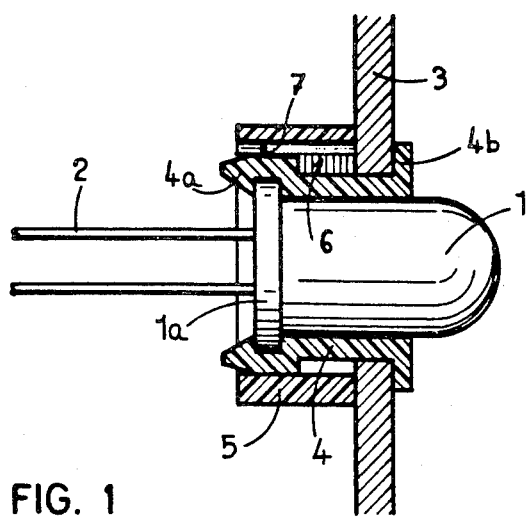
FIG. 1 is a longitudinal sectional view of a diode lamp mounted on a panel by means of a lamp holder.
Figure 2:
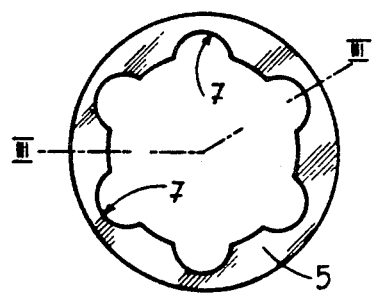
FIG. 2 is a plan view of a detail of the lamp holder.

The diode lamp represented in FIG. 1, designated by 1, comprises a cylindrical body made of epoxy, in which is embedded a metal filament 2 the only two ends of which, which are situated out from the body 1, are visible in the drawing. The body 1 is provided, at its basis, with a shoulder 1a.

Figure 3:
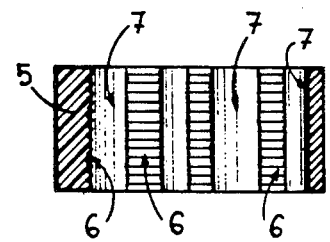
FIG. 3 is a sectional view along line III—III of FIG. 2.

The lamp 1 is secured to a panel 3 by means of a lamp holder comprising a clip 4, made of plastic material, for instance polyacetal or polypropylene, provided with longitudinal grooves and which is snapped, by means of an annular part 4a constituting a hook, on the shoulder 1a of the body 1 of the diode lamp. This clip 4 is provided, at its opposed end, with a shoulder 4b bearing on the panel 3. The lamp holder comprises moreover a ring 5, also made of plastic material like polyacetal or polypropylene, engaged on the clip 4 and which, on the one hand, prevents the clip from opening and, on the other hand, bears, by one of its ends, on the back of the panel 3 which is thus gripped between the ring and the shoulder 4b of the clip 4. The inner face of the wall of the ring 5 is scratched at 6 (FIG. 3) so that the ring is securely held to the clip 4.

The outer diameter of the clip 4 being able to vary with the variations of the diameter of the body 1 of the diode lamp, the ring 5 is provided with inner grooves 7 intended to confer thereto some resiliency. These grooves are longitudinal and of semi-circular cross section and are provided in the wall of the ring, so that they produce a thinning of this wall and give to the ring an elasticity which is sufficient for permitting to the ring to adapt itself to the variations of the dimensions of the clip.

In the example as represented, the grooves 7 are in the number of six, arranged at 60° to each other. They could be of a different number, equally distributed angularly; one could also provide the case where a ring would have only one inner groove. The same way, the cross section of these grooves could be other than half-circular, such as triangular, oval or or equivalent shapes.

It is to be noted that the present invention is also applicable to the lamp holders which are intended to support diode lamps having a conical or a parallelepipedic body, of rectangular or of square cross section.

What is claimed:

1. A miniature lamp holder for holding a lamp on a bracket comprising an annular clip surrounding the lamp and a ring having a central axis, a wall and engaging said clip for maintaining the clip pressed on the lamp and for securing the lamp holder on the bracket intended to receive it, in which said wall of said ring is provided with at least one longitudinal inner recess parallel with said axis and producing a thinning of its wall owing to which said ring is able to be deformed resiliently and thus absorb the irregularities of the diameter of lamps of various sizes due to the tolerances of lamp manufacturing.

2. A lamp holder as claimed in claim 1, in which said ring is provided with at least two of said recesses, each of said recesses separated from the adjacent recess by an equal angular distance.

3. A lamp holder as claimed in claim 1, in which said recess is constituted by a longitudinal groove provided in the wall of the ring.

4. A lamp holder as claimed in claim 3, in which said groove is of half-circular cross section.

* * * * *